United States Patent
Houston

(12) 
(10) Patent No.: US 6,512,272 B1
(45) Date of Patent: Jan. 28, 2003

(54) INCREASED GATE TO BODY COUPLING AND APPLICATION TO DRAM AND DYNAMIC CIRCUITS

(75) Inventor: Theodore W. Houston, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/685,038

(22) Filed: Oct. 10, 2000

Related U.S. Application Data

(62) Division of application No. 09/365,068, filed on Jul. 30, 1999, now Pat. No. 6,261,886.
(60) Provisional application No. 60/095,254, filed on Aug. 4, 1998.

(51) Int. Cl.[7] .......................... H01L 29/76; H01L 29/94; H01L 31/062; H01L 31/113; H01L 31/119
(52) U.S. Cl. .................. 257/368; 257/369; 257/404
(58) Field of Search ................ 257/368, 369, 257/335, 338, 345, 404, 408

(56) References Cited

U.S. PATENT DOCUMENTS 4,463,492 A * 8/1984 Maeguchi .................. 438/166
5,789,778 A * 8/1998 Murai ......................... 257/325
5,841,170 A * 11/1998 Adan et al. .................. 257/345

* cited by examiner

*Primary Examiner*—Olik Chaudhuri
*Assistant Examiner*—Hoai Pham
(74) *Attorney, Agent, or Firm*—Wade James Brady, III; Frederick J. Telecky, Jr.

(57) ABSTRACT

An FET and DRAM using a plurality of such FETs wherein each transistor has a body region of a first conductivity type including a relatively high $V_T$ region and relatively low $V_T$ region, the high $V_T$ region disposed contiguous with the low $V_T$ region. A pair of source/drain regions of opposite conductivity type are disposed on a pair of opposing sides of each of the low $V_T$ region. The transistor includes a gate oxide over the body region and a gate electrode over the gate oxide and spaced from the body region. The body region is p-doped or n-doped with the high $V_T$ region more heavily doped than the remainder of the body. In a further embodiment, the FET includes a body region of a first conductivity type which includes a relatively low $V_T$ region and a first pair of relatively high $V_T$ regions on a first pair of opposing sides of the body. A pair of source/drain regions of opposite conductivity type are disposed on a second pair of opposing sides of each of the low $V_T$ region. A gate oxide is disposed over the body region and a gate electrode is disposed over the gate oxide and spaced from the body region.

22 Claims, 1 Drawing Sheet

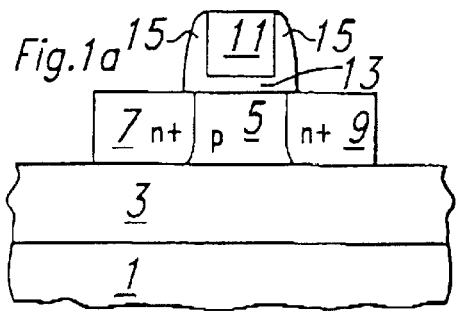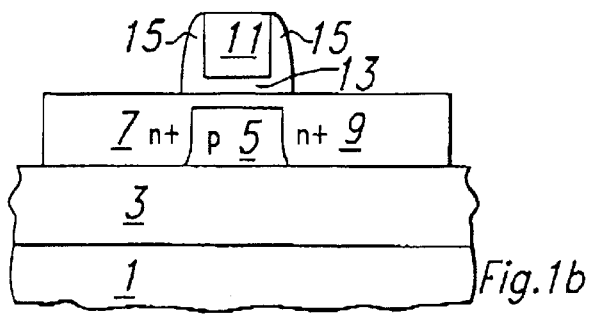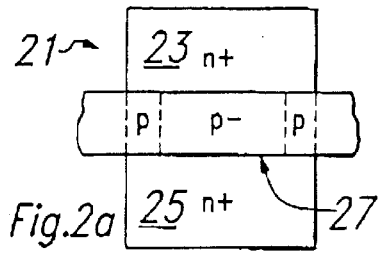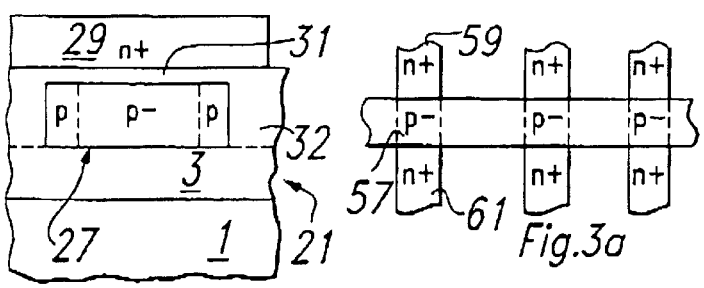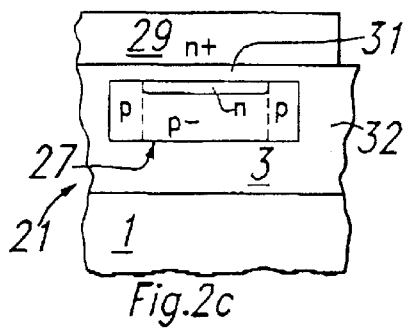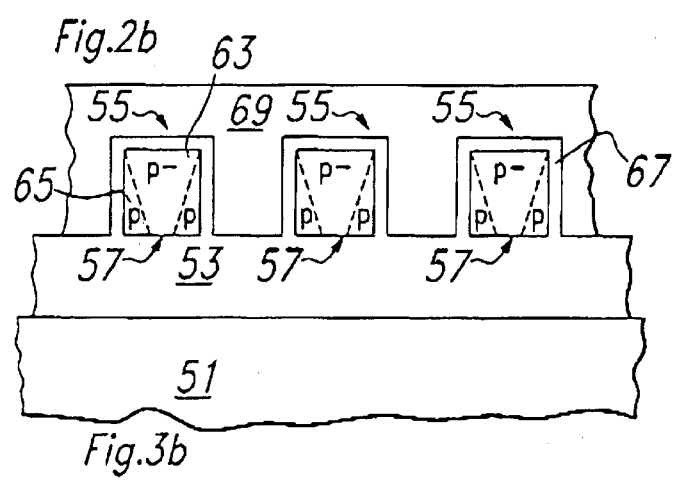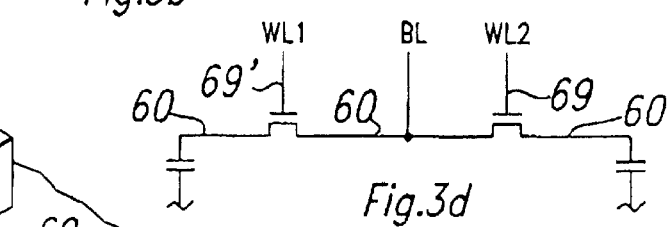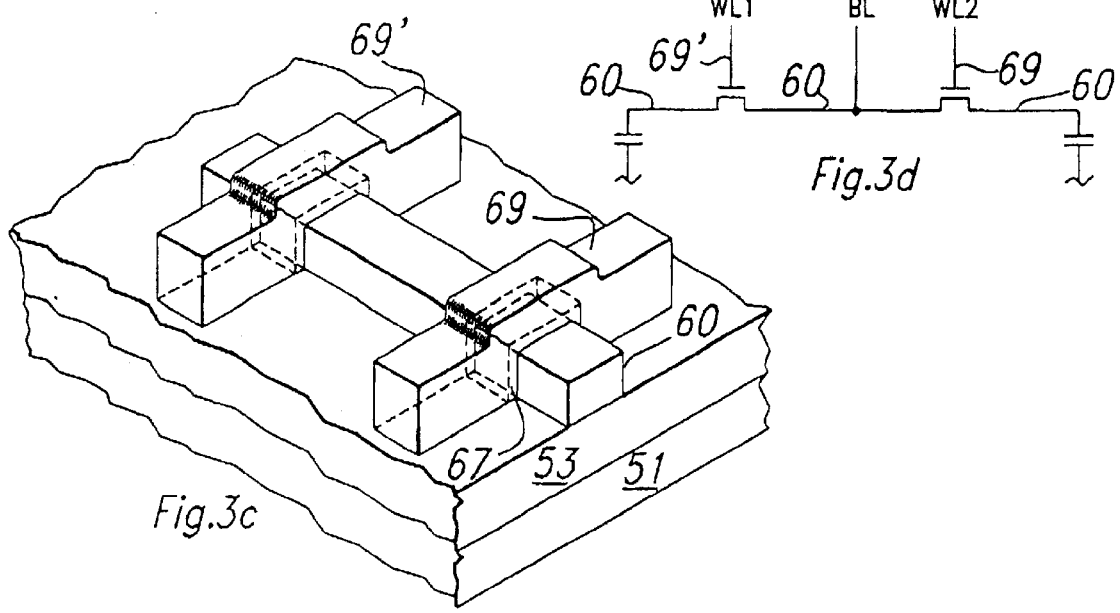

INCREASED GATE TO BODY COUPLING AND APPLICATION TO DRAM AND DYNAMIC CIRCUITS

CROSS REFERENCE TO PRIOR APPLICATIONS

This application is a division of Ser. No. 09/365,068 filed Jul. 30, 1999 now U.S. Pat. No. 6,261,886 which claims priority based upon provisional application Serial No. 60/095,254, filed Aug. 4, 1998.

BACKGROUND OF THE INVENTION

1. Field of the Invention

This invention relates to threshold voltage modulation in FET semiconductor devices.

2. Brief Description of the Prior Art

The threshold voltage, $V_T$, of a field effect transistor (FET) depends upon the voltage on the substrate or body region (the region between the source region and the drain region). The threshold voltage can be changed by changing the body voltage. For an n-channel transistor, an increase in body voltage lowers (makes less positive or more negative) the threshold voltage. For a p-channel transistor, an increase in the body voltage raises (makes more negative or less positive) the threshold voltage, $V_T$. Accordingly, for an n-channel transistor, when the gate voltage goes high, the capacitive coupling to the body region raises the body voltage and lowers the threshold voltage. This provides increased drive current. When the gate is turned off, the gate coupling raises the threshold voltage by lowering the body voltage, thereby providing decreased leakage current when the transistor is off. This capacitive coupling of the gate to the body is significant only when the conductive channel (inversion region) from the source region to the drain region is not formed. When the conductive channel is formed, it electrically isolates the gate from the body. Therefore, after the channel is formed, the advantage of the capacitive coupling of the gate to the body is no longer improved.

In the prior art, the edges of a transistor were sometimes doped more heavily to prevent leakage at the edge. The more heavily doped edge region would have a higher $V_T$ and thus the gate-to-body capacitive coupling would exist at the edge region for a greater range of gate voltage than at the channel region. However, the more heavily doped region would be made as small as practical, and a sidewall dielectric thicker than the gate. oxide would generally be used. A sidewall insulator is required with mesa isolation. With shallow trench isolation (STI), the space between sidewalls is filled with dielectric. In the prior art, the sidewall insulator is typically several time the thickness of the gate oxide. Thus, the contribution of the highly doped edge region to the gate-to-body coupling would not be substantial.

Assuming, for example, an n-channel transistor, coupling of the gate to the body of the transistor causes dynamic $V_T$ modulation, thereby increasing $V_T$ when the transistor is off and decreasing $V_T$ when the transistor is on. However, direct coupling from the gate to a body contact results in gate current and diminished chip area. These problems have been attacked in the prior art by providing separate capacitors which are connected between the gate and the body of the transistor. This eliminates gate current but still diminishes chip area. Also, resistance in the connection of the capacitor to the body diminishes the effectiveness of the coupling. It is therefore desirable to increase the capacitive coupling between the gate and the body of a FET as well as to do so in a more economical, more effective and simpler procedure.

SUMMARY OF THE INVENTION

The above noted desires are readily accomplished in accordance with the present invention in a simple and economical manner.

Briefly, to provide an enhancement of on current and a suppression of leakage current with voltage change on the gate of an FET, the capacitive coupling between the gate and the body of the FET is increased by providing a region under the gate, contiguous with the channel region, having a much higher threshold voltage than the channel region. This region may be adjacent to one or both edges of the channel region, going from source to drain. For silicon on insulator (SOI) transistors with a mesa structure, the high $V_T$ region may be adjacent to a mesa edge (referred to as a transistor sidewall). Here, higher $V_T$ means more positive (less negative) for n-channel and more negative (less positive) for p-channel. Alternatively, the high $V_T$ region may be anywhere along the width of the transistor and may be encompassed within the low $V_T$ region. Multiple high $V_T$ regions may be distributed within the channel region.

Coupling of the gate to the body is further increased by using a leaky gate dielectric. However, gate leakage through the gate oxide can be to the body region only when the channel is not formed. Thus, this method of influencing the body voltage is more effective in a high $V_T$ region. Having a thin gate dielectric also has well known benefits in drive current and reduced short channel effects. However, gate leakage to the source, drain or channel is generally not desirable. A structure with selectively thin (less than 20 nanometers) or leaky gate dielectric over the high $V_T$ region maximizes the beneficial influence of the gate coupling to the body while reducing total gate leakage. In the case of the leaky dielectric, the dielectric over the high $V_T$ region is leakier than the dielectric over the low $V_T$ region. This can be accomplished by, for example, growing a thin oxide, e.g. 15 nanometers,, depositing a nitride and patterning and etching the nitride/oxide stack to expose the low $V_T$ regions. The gate oxide is then grown, the remaining nitride is stripped and the procedure progresses in standard manner. Although this arrangement is not the same as a direct contact to the body, the gate current influence on the body potential is beneficial.

The capacitive coupling of the gate to the body provides a floating body with some of the benefits of dynamic $V_T$ modulation. This capacitive coupling is reduced by the shielding of the gate from the body by the channel when the channel is formed. It has been suggested in the prior art to build a separate capacitor to capacitively couple the gate to the body. This extra capacitance can be built efficiently in accordance with the present invention by having extra doping in portions of the channel to raise the $V_T$ in those regions. Since the high $V_T$ region is adjacent to the channel region, there is minimal series resistance between the capacitive coupling to the gate and the body region at the channel. If this capacitance is provided at the edges of the transistor, this will have the extra benefit of suppressing any edge leakage. This can be accomplished in a self-aligned manner using what has been previously described for edge implant, but with a larger offset to provide area for the gate-to-body capacitance.

For example, a nitride is deposited over the pad oxide and patterned and etched for a moat (undersized). Then polysilicon sidewalls are added and the isolation, such as trench isolation or LOCOS, is formed. The polysilicon sidewalls are removed and a channel stop is implanted to form the capacitor area. Standard processing of the transistor, including $V_T$ implants, follows. The described process forming and later removing sidewalls on the patterned moat masking layer has the advantage of selfalignment of the high $V_T$ regions to the transistor edge. High $V_T$ regions interior to the transistor edges can also be formed with the described process sequence by including relatively narrow spaces (less than twice the sidewall width) in the nitride pattern where the high $V_T$ regions are to be formed. Alternatively, the moat masking layer can be further patterned after formation of the isolation and prior to the high $V_T$ implant. Typically, the species implanted into the high $V_T$ region and the low $V_T$ region will be the same conductivity type. Other variations of process sequence that can be used to form selective high $V_T$ regions, such as the use of counter doping schemes, will become apparent to those skilled in the art. For wide transistors, it is desirable to have a plurality of high $V_T$ regions distributed across the width of the transistor. It is not necessary that a high $V_T$ region extend to either source/drain region.

The extra gate-to-body coupling is particularly attractive for DRAM word lines (W/L) to couple the body voltage low when the W/L shuts off. It would also couple high when the W/L is on, boosting initial charge transfer, but this will be reduced by recombination, so the net effect will be a lower body voltage when W/L goes off. This will lengthen the time for generation current to cause a forward bias, thus the retention time will be lengthened. A similar benefit applies to other dynamic circuits.

Increased W/L to body capacitance significantly lowers the body node voltage when the W/L turns off, increasing retention times. One way to do this is to use sidewall capacitance. This is accomplished, for example, by providing a substrate having a buried oxide thereover with a silicon mesa formed on the outer surface of the buried oxide, the transistor being formed in the mesa. A gate, such as a word line, is formed wrapping around the sides and outer surface of the mesa, separated from the mesa by a thin dielectric. The transistor channel is formed at the outer surface of the mesa and the higher $V_T$ gate-to-body capacitance coupling is formed at the sides of the mesa. The sidewall dielectric is of approximately the same thickness as or, for the leaky dielectric case, thinner than the gate dielectric to provide high capacitance. This form is particularly appropriate for relatively narrow transistors (width less than five times the length) as commonly used as pass gate or access transistors in a memory such as a DRAM. Prior art includes a similar structure, but with thicker sidewall dielectric that reduces the capacitive coupling of the gate to body, or with sidewall $V_T$ low enough that sidewall channels form, thereby screening the gate coupling to the body.

The channel region can be formed by masking the body to expose the region of the body to be a high $V_T$ Portion of the channel, implanting a dopant of the opposite conductivity type into the high $V_T$ portion, exposing the entire channel region and then implanting a dopant of the opposite conductivity type into the entire channel to form the high $V_T$ portion of the channel and the low $V_T$ portion of the channel in the remaining portion of the channel.

One of the usual problems with the previously described structure with thin sidewall dielectric is the unwanted formation of gate filaments along the bottom corner of the mesa. One way to avoid this is to use a damascene gate process flow. An oxide/nitride stack is formed on the other surface of the silicon film of an SOI wafer. The moat or active region is patterned, the trench is etched to the buried oxide and the upper corners of the mesa are rounded. An optional sidewall implant is performed. A thin oxide is grown on the sidewalls followed by an optional sidewall implant. The top nitride is removed, leaving the oxide. A dielectric is deposited. A trench is patterned and etched for a gate. Sidewalls are optionally added inside the trench to make the gate length (L) shorter and the channel implants are provided. The oxide is stripped and the gate oxide is grown followed by deposition of the gate material. This is followed by a chemical mechanical polish (CMP). The deposited dielectric is then removed and the process proceeds in standard manner. Other process sequences, such as, for example, disposable gate, will become apparent to those skilled in the art.

An integrated circuit may be formed with all the transistors having enhanced gateto-body capacitance. Alternatively, only one type of transistor, e.g., n-channel, may have enhanced gate-to-body capacitance. As a further alternative, enhanced gate-to-body capacitance may be applied selectively to individual transistors of either type.

The clocked transistors of dynamic logic are good candidates for gate to body capacitance. Pull-up transistors (transistors which raise the voltage toward VDD) are also good candidates to have extra capacitance from gate to body. Note that this does not provide a great deal of capacitance on the clock because the gate to body capacitance is in series with the body to substrate capacitance. The capacitance should bring the body voltage lower (higher for p-channel) when off, so this allows a lower $V_T$ for the same leakage, as long as the clock is running. If left off on the order of a millisecond, the body will drift up (down for p-channel), letting leakage back up so other techniques for reducing leakage current during standby may still be required.

The invention is applied to both bulk and SOI transistors. For SOI, one configuration in the prior art is to have no direct (ohmic) contact of the body region to a supply or signal voltage. In this configuration, the body voltage responds readily to capacitive coupling. Generally, for bulk and some SOI configuration, the body region is connected directly to a supply or signal voltage. For bulk technology, this is generally referred to as the well voltage. Even in this latter configuration, the transient voltage of a local region of the body can respond to capacitive coupling. The close proximity of the capacitive coupling region to the channel region provided by this invention enhances the effectiveness of the capacitive coupling in modulating the effective $V_T$ when there is also an ohmic connection of the body to a signal or supply voltage. This is also true for the embodiment of this invention in which a leaky dielectric is used to separate the gate from the body at a high $V_T$ region.

The above description pertains to n-channel devices, it being understood that polarities would be reversed for p-channel devices.

BRIEF DESCRIPTION OF THE DRAWINGS

FIGS. 1a and 1b are cross sectional views of a typical FET showing the status of the channel in the off (FIG. 1a) and on (FIG. 1b) state;

FIG. 2a is a top view and FIGS. 2b and 2C are cross sectional views in the off and on state respectively of a transistor in accordance with the present invention;

FIGS. 3a to 3c are top, cross section and perspective views respectively of a plurality of transistors in accordance with a further embodiment of the invention for use in a DRAM; and FIG. 3d is a circuit diagram of the circuit shown in FIG. 3c.

DESCRIPTION OF THE PREFERRED EMBODIMENT

Referring first to FIGS 1a and 1b, in both figures there are shown a silicon on-insulator (SOI) structure which includes a substrate 1 over which is a buried oxide 3. A layer of semiconductor material has been fabricated to provide an n-channel device and has a central p-type body region 5 bounded by n+ type source/drain regions 7 and 9. A gate electrode 11 is spaced from the body region 5 by a layer of oxide 13 with sidewall oxide or nitride 15 extending along the sidewalls of the gate electrode. When the transistor is off (no n-channel conductive path from source to drain), the gate is capacitively coupled to the body as shown in FIG. 1a. However, when the transistor is on, there is a channel region between and connecting the source/drain regions 7 and 9, thereby screening the gate electrode 11 from the reduced body region 5 as shown in FIG. 1b.

Referring to FIGS. 2a to 2c, there is shown an n-channel transistor in accordance with a first embodiment of the present invention with high $V_T$ regions at the transistor sidewalls wherein FIG. 2a is a top view and FIGS. 2b and 2c are identical cross sectional views, FIG. 2b showing the arrangement with the transistor off and FIG. 2c showing the transistor on. As shown in FIGS. 2a to 2c, there is a moat or active region 21 which contains the same n+ source/drain regions 23 and 25 and the same P-channel region 27 as shown in FIGS. 1a and 1b. A gate electrode 29 is provided and spaced from the moat region by a gate oxide 31. A region of higher $V_T$ than for region 27, shown as a p-type region, is formed between each of the source/drain regions 23 and 25 and the channel or body region 27. A standard trench fill 32 is then provided. As can be seen in FIG. 2c, when the transistor is on, a part of the channel or body region 27 is inverted to N-type, thereby screening a portion of the body region the channel from the gate. However, in contrast to the device of FIG. 1b, the high $V_T$ regions provide continued capacitive coupling of the gate to the body for a greater range of the gate voltage.

Referring now to FIGS. 3a to 3c, there is shown a further embodiment of the invention which can be used for DRAMs using sidewall capacitance to the body, wherein FIG. 3a is a top view, FIG. 3b is a cross sectional view and FIG. 3c is a perspective view of a portion of the view in FIG. 3b and also showing an additional transistor along the same bit line. This structure includes within the active region a substrate 51 having a buried oxide 53 thereover with a plurality of spaced apart transistors 55 over the buried oxide. Each transistor 55 includes a central P-type region 57 with N+ type source/drain regions 59 and 61 on a first pair of opposing sides thereof as in the prior embodiments. The p-type channel region 57 includes a p–channel region 63 with p+ high $V_T$ regions 65 on the other pair of opposing sides of the channel region. An oxide layer 67 is disposed along the sidewalls as well as the upper surface of the central p-type region with a gate electrode 69 (69') disposed over the oxide layer. FIG. 3d is a circuit diagram of the circuit depicted in FIG. 3c.

In the above description, reference is made to a high $V_T$ region. Here, low $V_T$ refers to the intended $V_T$ for operation of the transistor and high $V_T$ is some $V_T$ higher than the low $V_T$, where the high $V_T$ region is to enhance the gate to body capacitance. The low $V_T$ may be relatively high or low for a given technology, depending upon the application. For example, for 1.8 V technology, the low $V_T$ may be 0.1 V for a high speed application or 0.6 V for a low power application. Multiple low $V_t$s may be used in the same integrated circuit. Similarly, different values for high $V_T$ may be chosen. A typical value may be 1 V for a 1.8 V technology. For the case where two "low" $V_t$s are used, one option is to have the higher "low" $V_T$ transistors unenhanced and use the higher "low" $V_T$ as the capacitance enhancing "high" $V_T$ in the transistors with the lower "low" $V_T$. Other possible combinations of $V_t$s will become apparent to those skilled in the art.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modification. For example, while the invention is described in terms of n-channel transistors, it applies equally to p-channel transistors with polarity and doping types reversed. Also, the structures described specifically for DRAM can also be applied to other memories, such as, for example, SRAM, or to logic circuits.

What is claimed is:

1. A FET which comprises:
   (a) a body region of a first conductivity type;
   (b) a gate separated from said body region by a gate dielectric ;
   (c) a pair of source/drain regions of opposite conductivity type on a first pair of opposing sides of said body region; and
   (d) each of high $V_T$ regions and a low $V_T$ region, said low $V_T$ region and said high $V_T$ region extending in said body under said gate dielectric from a region adjacent one source/drain region to a region adjacent to the other source/drain region, said high $V_T$ regions being disposed adjacent said low $V_T$ region and on opposing sides of said low $V_T$ region, the dielectric separating the gate from the high $V_T$ regions being more leaky than the dielectric separating the gate from the low $V_T$ region, such that said high $V_T$ regions contribute substantially to the gate-to-body capacitive coupling.

2. The FET of claim 1 wherein said body region is resistively coupled to a voltage source.

3. The FET of claim 1 wherein said FET is an SOI transistor.

4. The FET of claim 1 wherein said FET is a bulk transistor.

5. The FET of claim 1 wherein said FET has a sidewall, said high $V_T$ region being disposed at said sidewall of said FET, and said gate being separated from said sidewall by said dielectric of thickness comparable to the gate dielectric thickness.

6. The FET of claim 1 wherein said FET has edges, said high $V_T$ region being spaced from said edges of said FET.

7. The FET of claim 1 wherein the portion of said gate dielectric disposed over said high $V_T$ region is leaky relative to the portion of said gate dielectric disposed over said low $V_T$ region.

8. A memory which comprises:
   (a) a bit line;
   (b) a storage node; and
   (c) an FET having a gate, a source, a drain and a body region extending between said source and said drain, said FET having means to enhance the coupling of said gate to said body, said means to enhance the coupling including each of high $V_T$ regions and a low $V_T$ region, said low $V_T$ region and said high $V_T$ regions extending in said body under said gate dielectric from a region adjacent one source/drain region to a region adjacent to the other source/drain region, said high $V_T$ regions being disposed adjacent said low $V_T$ region and on opposing sides of said low $V_T$ region, the dielectric separating the gate from the high $V_T$ regions being more leaky than the dielectric separating the gate from the low $V_T$ region, such that said high $V_T$ regions contribute substantially to the gate-to-body capacitive coupling.

9. The memory of claim 8 wherein said bit line is coupled to one of said source and drain and said storage node is coupled to the other of said source and drain.

10. The memory of claim 9 wherein said FET has a sidewall, said high $V_T$ regions being disposed at said sidewall of said FET, and said gate being separated from said sidewall by said dielectric of thickness comparable to the gate dielectric thickness.

11. The FET of claim 10 wherein said low $V_T$ region extends in said body under said gate dielectric from a region adjacent one source/drain region to a region adjacent to the other source/drain region, said high $V_T$ regions being disposed adjacent to a portion of said low $V_T$ region and between said low $V_T$ region and at least one of said source/drain regions, the portion of said gate dielectric disposed over said high $V_T$ regions being leaky relative to the portion of said gate dielectric disposed over said low $V_T$ region.

12. The FET of claim 9 wherein said low $V_T$ region extends in said body under said gate dielectric from a region adjacent one source/drain region to a region adjacent to the other source/drain region, said high $V_T$ regions being disposed adjacent to a portion of said low $V_T$ region and between said low $V_T$ region and at least one of said source/drain regions, the portion of said gate dielectric disposed over said high $V_T$ regions being leaky relative to the portion of said gate dielectric disposed over said low $V_T$ region.

13. The memory of claim 8 wherein said memory is a DRAM.

14. The memory of claim 9 wherein said memory is a DRAM.

15. The memory of claim 14 wherein said FET has a sidewall, said high $V_T$ regions being disposed at said sidewall of said FET, and said gate being separated from said sidewall by said dielectric of thickness comparable to the gate dielectric thickness.

16. The memory of claim 13 wherein said FET has a sidewall, said high $V_T$ regions being disposed at said sidewall of said FET, and said gate being separated from said sidewall by said dielectric of thickness comparable to the gate dielectic thickness.

17. The FET of claim 16 wherein said low $V_T$ region extends in said body under said gate dielectric from a region adjacent one source/drain region to a region adjacent to the other source/drain region, said high $V_T$ regions being disposed adjacent to a portion of said low $V_T$ region and between said low $V_T$ region and at least one of said source/drain regions, the portion of said gate dielectric disposed over said high $V_T$ regions being leaky relative to the portion of said gate dielectric disposed over said low $V_T$ region.

18. The memory of claim 8 wherein said FET has a sidewall, said high $V_T$ regions being disposed at said sidewall of said FET, and said gate being separated from said sidewall by said dielectric of thickness comparable to the gate dielectric thickness.

19. The FET of claim 18 wherein said low $V_T$ region extends in said body under said gate dielectric from a region adjacent one source/drain region to a region adjacent to the other source/drain region, said high $V_T$ regions being disposed adjacent to a portion of said low $V_T$ region and between said low $V_T$ region and at least one of said source/drain regions, the portion of said gate dielectric disposed over said high $V_T$ regions being leaky relative to the portion of said gate dielectric disposed over said low $V_T$ region.

20. The memory of claim 8 wherein said memory is an SRAM.

21. The FET of claim 8 wherein said low $V_T$ region extends in said body under said gate dielectric from a region adjacent one source/drain region to a region adjacent to the other source/drain region, said high $V_T$ regions being disposed adjacent to a portion of said low $V_T$ region and between said low $V_T$ region and at least one of said source/drain regions, the portion of said gate dielectric disposed over said high $V_T$ regions being leaky relative to the portion of said gate dielectric disposed over said low $V_T$ region.

22. A FET which comprises:
(a) a body region of a first conductivity type;
(b) a gate separated from said body region by a gate dielectric;
(c) a pair of source/drain regions of opposite conductivity type on a first pair of opposing sides of said body region; and
(d) a high $V_T$ region and a low $V_T$ region, said low $V_T$ region and said high $V_T$ region extending i said body under said gate dielectric from a region adjacent one source/drain region to a region adjacent to the other source/drain region, said high $V_T$ region being disposed adjacent said low $V_T$ region, the dielectric separating the gate from the high $V_T$ regions being more leaky than the dielectric separating the gate from the low $V_T$ region, such that said high $V_T$ regions contribute substantially to the gate-to-body capacitive coupling.

* * * * *